United States Patent [19]
Ferrier et al.

[11] Patent Number: 5,935,640
[45] Date of Patent: Aug. 10, 1999

[54] METHOD FOR ENHANCING THE SOLDERABILITY OF A SURFACE

[75] Inventors: Donald Ferrier, Thomaston; Eric Yakobson, Waterbury, both of Conn.

[73] Assignee: MacDermid, Incorporated, Waterbury, Conn.

[21] Appl. No.: 08/982,980

[22] Filed: Dec. 2, 1997

Related U.S. Application Data

[62] Division of application No. 08/621,098, Mar. 22, 1996, Pat. No. 5,733,599.

[51] Int. Cl.$^6$ ...................................................... B05D 5/12
[52] U.S. Cl. ............................ 427/98; 427/125; 427/304; 427/405; 427/437
[58] Field of Search ............................ 427/98, 125, 304, 427/405, 437; 106/1.23

[56] References Cited

U.S. PATENT DOCUMENTS

| | | | |
|---|---|---|---|
| 3,162,512 | 12/1964 | Robinson | 39/199 |
| 3,202,488 | 8/1965 | Ehrreich et al. | 428/570 |
| 3,978,271 | 8/1976 | Greenberg | 428/433 |
| 4,189,510 | 2/1980 | McIntyre et al. | 427/125 |
| 4,940,181 | 7/1990 | Juskey, Jr. et al. | |
| 4,978,423 | 12/1990 | Durnwirth, Jr. et al. | |
| 5,160,579 | 11/1992 | Larson | |
| 5,173,130 | 12/1992 | Kinoshita et al. | |
| 5,186,984 | 2/1993 | Gabbert | 427/443.1 |
| 5,235,139 | 8/1993 | Bengston et al. | 174/257 |
| 5,733,598 | 3/1998 | Sera et al. | 427/96 |

FOREIGN PATENT DOCUMENTS

| | | | |
|---|---|---|---|
| 3002379 | 8/1991 | Japan | C23C 18/44 |
| 1120583 | 7/1968 | United Kingdom | H05K 3/06 |
| 9617974 | 6/1996 | WIPO | C23C 18/42 |
| 9617975 | 6/1996 | WIPO | C23C 18/42 |

*Primary Examiner*—Brian K. Talbot
*Attorney, Agent, or Firm*—John L. Cordani

[57] ABSTRACT

A process for enhancing the solderability of a surface through the use of immersion silver deposits is disclosed. In the preferred embodiment two immersion deposits are utilized in sequence. A composition for immersion silver plating is also disclosed.

5 Claims, No Drawings

METHOD FOR ENHANCING THE SOLDERABILITY OF A SURFACE

This application is a divisional of application Ser. No. 08/621,098, filed Mar. 22, 1996 now U.S. Pat. No. 5,733, 599.

FIELD OF THE INVENTION

This invention relates generally to a method of treating a surface which treatment enhances the solderability of the surface. The method is particularly useful in the fabrication and assembly of printed circuit boards.

BACKGROUND OF THE INVENTION

Soldering is generally used for making mechanical, electromechanical, or electronic connections to a variety of articles. The distinction between expected functions of the joints is important because each application has its own specific requirements for surface preparation. Of the three soldering applications, making electronic connections is the most demanding.

In the manufacture of electronic equipment utilizing printed circuits, connections of electronic components to the printed circuits are made by soldering of the leads of the components to the through-holes, surrounding pads, lands and other points of connection (collectively, "Areas of Connection"). Typically the connection occurs by wave soldering techniques.

To facilitate this soldering operation, the printed circuit fabricator is required to arrange that the through-holes, pads, lands and other points of connection are receptive to the subsequent soldering processes. Thus these surfaces must be readily wettable by the solder and permit an integral conductive connection with the leads or surfaces of the electronic components. Because of these needs, printed circuit fabricators have devised various methods of preserving and enhancing the solderability of surfaces.

One means of arranging good solderability of the surfaces in question is to provide the surfaces with a pre-coating of solder. In printed circuit fabrication, however, this method has several drawbacks. Since it is not easy to selectively provide these areas with solder, all conductive areas of the board must be solder plated. This can cause severe problems with the subsequent application of solder mask.

Another means of arranging good solderability of these surfaces is to plate them with a final finish coating of a precious metal such as gold, palladium or rhodium. U.S. Pat. No. 5,235,139 (Bengston, et. al.), the teachings of which are incorporated herein by reference, proposes a method for achieving this previous metal final finish. Bengston et. al. propose plating the copper areas to be soldered with electroless nickel-boron, followed by a precious metal coating such as gold. See also U.S. Pat. No. 4,940,181 to Juskey, Jr. et al., the teachings of which are incorporated herein by reference for a similar process which teaches the plating of electroless copper, followed by electrolytic copper, followed by nickel followed by gold as a solderable surface. These processes work well but are time consuming and expensive.

Various attempts have been made to selectively apply solder to the necessary areas only. One such method involves use of organic etch resists over the solder plated areas of connection followed by selective stripping of tin-lead from the copper traces before application of the solder mask. See U.S. Pat. No. 4,978,423 to Durnwith et. al. See also U.S. Pat. No. 5,160,579 to Larson, the teachings of which are incorporated herein by reference, for other known selective solder processes.

Soldering directly to copper surfaces has been difficult and inconsistent. These problems are due mainly to the inability of keeping the copper surfaces clean and free of oxidation throughout the soldering operation. Various organic treatments have been developed to preserve copper surfaces in a readily solderable state. For example, see U.S. Pat. No. 5,173,130 (Kinoshita) which teaches the use of certain 2-alkylbenzimidazoles as copper pre-fluxes to preserve the solderability of the copper surfaces. Treatments such as those taught in Kinoshita have proven successful but there is still need to improve the reliability of the process.

SUMMARY OF THE INVENTION

The current invention proposes the use of an immersion silver coating as an improved solderability preservative for various surfaces, particularly copper surfaces. Preferred compositions for depositing the immersion silver coating are also disclosed. In the most preferred embodiment of the invention a second immersion coating of a metal more noble than silver is deposited over the immersion silver coating. The process proposed is a versatile, low cost method for effectively preserving the solderability of surfaces, particularly copper surfaces and areas of connection on printed circuit boards.

DETAILED DESCRIPTION OF THE INVENTION

It has been discovered that immersion silver deposits provide excellent solderability preservatives, which are particularly useful in the fabrication of printed circuit boards. The solderability achievable with a simple immersion silver deposit in printed circuit applications has unexpectedly been found to exceed that achievable with prior art nickel-gold plating processes such as described in U.S. Pat. No. 5,235, 139 and unexpectedly exceeds that achievable with other immersion deposits. As can be seen in the examples to follow, the processes of the current invention yield surfaces which are very solderable under adverse conditions. In printed circuit applications the surfaces are wire bondable.

Immersion plating is a process which results from a replacement reaction whereby the surface being plated dissolves into solution and at the same time the metal being plated deposits from the plating solution onto the surface. The immersion plating initiates without prior activation of the surfaces. The metal to be plated is generally more noble than the surface metal. Thus immersion plating is usually significantly easier to control and significantly more cost effective than electroless plating, which requires sophisticated auto catylitic plating solutions and processes for activation of the surfaces prior to plating.

The inventors have found the following immersion silver composition particularly suitable to use in the processes of the current invention:

a). a soluble source of silver ions;

b). an acid;

c). an imidazole or imidazole derivative; and d). optionally, an oxidant.

The soluble source of silver ions can be derived from a variety of silver compounds. The inventors have found silver nitrate to be most preferable. The concentration of silver in the plating solution can range from 0.1 to 25 grams per liter, but is most preferably present in a concentration of 0.5 to 2 grams per liter.

Although a variety of acids are suitable for use in this formulation, the inventors have found that methane sulfonic acid is most preferred. The concentration of acid in the plating solution can range from 1 to 150 grams per liter but is preferably in the range of 5 to 50 grams per liter.

The inventors have discovered that the inclusion of imidazole or imidazole derivative of the following formula has a significant positive impact upon the plate produced by immersion plating solutions, particularly immersion silver plating solutions used in the processes of this invention:

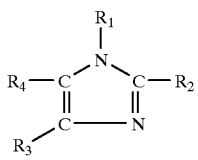

wherein $R_1$, $R_2$, $R_3$ and $R_4$ are independently selected from the group consisting of substituted or unsubstituted alkyl groups, substituted or unsubstituted aryl groups, hologens, nitro groups and hydrogen.

The inclusion of an imidazole as described above brightens the plated deposit and improves the integrity and physical properties of the resultant plated deposit. In addition, the imidazole also extends the useful life of the immersion plating solution. The inventors have found that histidine is a particularly preferred imidazole for the purposes of these processes.

The inclusion of imidazoles provides significant advantages in immersion plating solutions in general but is particularly useful and advantageous in immersion silver plating. The inventors have found that immersion silver deposits resulting from plating baths containing imidazoles are brighter, smoother and more cohesive than immersion silver deposits plated from baths which do not have imidazoles. In addition the immersion plating baths with imidazoles have longer effective lives than comparable baths without imidazoles. These same advantages are achievable by the inclusion of imidazoles in other immersion plating baths, including copper, palladium, gold, rutheneum and rhodium.

Finally, with respect to the immersion silver compositions useful in the present invention, the plating solution may, optionally, advantageously also contain an oxidant. The inventors have found that nitro aromatic compounds most preferably dinito compounds, such as 3,5 dinitrohydroxybenzoic acid are preferred in this regard. The concentration of such an oxidant in the solution can range from 0.1 to 25 grams per liter, but is preferably from 0.5 to 2 grams per liter.

The immersion silver solution can be used in the processes of the current invention at temperatures ranging from room temperature to 200° F. but is preferably used at from 80 to 120° F. The time for immersion in the plating solution can range from 1 to 30 minutes but is preferably from 3 to 6 minutes.

The immersion silver solution of the current invention is thus used to plate a thin layer of silver onto the surface to be soldered. It is believed that the resultant silver coating should be from 1 to 100 micro inches thick, preferably from 20 to 60 micro inches thick for effective enhancement and preservation of the solderability of the surface. Although this process is effective in soldering many surfaces, it is particularly useful in soldering copper surfaces, such as Areas of Connection on printed circuit boards.

In the most preferred embodiment of the current invention, the immersion silver deposit is then plated upon with second immersion coating of a metal more noble than silver, such as gold, palladium, ruthenium or rhodium. The inventors have found that immersion gold is particularly useful in this regard.

It was discovered that while a single layer of immersion coating offers solderability protection and enhancement, due to the inherent porasity of immersion deposits, a double immersion coating consisting of a first metal which is more noble than the base metal followed by a second metal which is more noble than the first metal provides unexpectedly better results. The first metal may consist of silver (as described herein or otherwise) or another metal which is more noble than the base. In the case of copper as the base, the first metal can consist of silver, tin, palladium, ruthenium, rhodium, bismuth or the like. The second metal must be chosen such that it is more noble than the first metal. An example of a second metal which is workable with the first metals noted above would be gold. The importance of the invention however is that the process consists of two immersion coatings consisting of a first metal which is more noble than the base followed by a second metal which is more noble than the first metal. The most preferred combination of immersion coatings where copper or nickel is the base material is immersion silver, as taught herein, followed by immersion gold.

Although not wishing to be bound by theory, it is believed that the first (silver) immersion coating is inherently porous and therefore may leave some pathways to the underlying (copper) surface exposed. When the suggested second immersion coating is applied, these more noble metal ions have an access not only to the intermediate metal layer, but also to the base layer via the pores. Since the difference between the standard red-ox potential of the base and the top layer is greater than that between the base and intermediate layers, the immersion reaction will proceed with a much faster rate in the pores (ie. on any exposed base metal). Therefore the most noble top layer metal will completely seal the base surface before it builds an immersion deposit of adequate thickness on the intermediate metal layer. It is thus believed that this synergy provides the optimum solderability.

Although this technique may be utilized advantageously over almost any surface, it is most useful in the fabrication of printed circuit boards, particularly solder mask over bare copper (SMOBC) boards. Thus, in fabricating SMOBC boards, the solder mask is applied to the surfaces of the board then exposed and developed to reveal the Areas of Connection. These Areas of Connection are then essentially the only exposed areas of copper on the board, with the remainder essentially being covered by solder mask. These exposed Areas of Connection are thus destined to be points of attachment, in most cases by soldering, when the electronic components are later placed on the board later in the fabrication cycle. Therefore, the solderability of these exposed points, generally copper, must be enhanced and preserved.

Thus according to the current invention these areas are then preferably cleaned, using an acid cleaner, and subsequently microetched to prepare the surface for acceptable immersion plating. Following this preferred preparation, the board is immersed in the immersion silver plating solution, such that a silver deposit of appropriate thickness is achieved. In the most preferred embodiment the board is then immersed in a second immersion plating solution which plates a metal more noble than the silver, such that a top coating of this third metal is achieved at a thickness of from 0.5 to 25 micro inches.

The invention is further described for illustrative purposes only in the following examples which are in no way limiting of the invention itself.

EXAMPLE I

Several plated through hole printed circuit boards were fabricated through the following cycle:
1. Drill holes through copper clad laminate.
2. Process boards through standard plated through hole cycle to plate electroless copper in the holes and on the surface.
3. Apply a plating mask.
4. Electrolytically plate copper to desired thickness in the holes and on the exposed circuitry.
5. Electrolytically plate tin in holes and on exposed circuitry to serve as an etch resist.
6. Strip the plating resist.
7. Etch the exposed copper (ie. copper not plated with tin)
8. Strip the tin.
9. Apply, image and develop a soldermask such that the soldermask covers the substantially entire board surface except for the Areas of Connection.
10. Clean and microetch the Areas of Connection.
11. Immersion plate the Areas of Connection with the following silver immersion plating solution to a thickness of 25 micro inches:

Silver Nitrate—1 gr/liter

Methane Sulfonic Acid (70%)—20 ml/liter 3,5 dinitrohydroxy benzoic acid—1 gr/l

1-Histidine—1 gr/l

Water—to 1 liter

Temperature—100° F.

Time—5 minutes

Note: Fresh water rinses were interposed between each chemical processing step above.

The silver plated in a smooth adherent fashion onto the copper surfaces. The boards were then subjected to accelerated aging by exposing them in a humidity chamber to 100% relative humidity at 93° C. for 8 hours. The boards were then dried at 130° C. for 5 minutes. The boards were dipped for 10 seconds in no clean/no residue Interflux IF 2005M flux, allowed to drain for 60 seconds then floated in molten solder at 475° F. for 10 seconds. The coverage of solder over the metallic surfaces of the boards was then evaluated on a percentage basis and found to be approximately 98.9%.

EXAMPLE II

Several plated through hole printed circuit boards were fabricated through the same process as in Example I, except that after step 11, the following sequence was followed:
12. The boards were plated with immersion gold using MacDermid Immersion Gold XD-6268 (available from MacDermid, Incorporated, 245 Freight Street, Waterbury, Conn. 06702). The temperature was 180° F. and the time was 2 minutes.

The boards were then aged and evaluated in the same way as in Example I. The resultant coverage on a percentage basis was found to be approximately 99.6%.

EXAMPLE III

Several plated through hole printed circuit boards were fabricated through the same process as in Example I, except that after step 10, the following alternate sequence was followed:
11. The boards were plated in electroless nickel using MacDermid Planar Electroless Nickel at 170° F. for 5 minutes.
12. The boards were plated in MacDermid Immersion Gold XD-6268 at 180° F. for 5 minutes.

The boards were then aged and evaluated in the same way as in Example I. The resultant coverage on a percentage basis was found to be approximately 58.50%.

What is claimed is:

1. A process for enhancing the solderability of a surface, which process comprises:
   a). immersion plating silver onto the surface prior to soldering; and
   b). soldering directly upon the silver plate;
   wherein the silver is plated from a solution comprising an imidazole of the following formula:

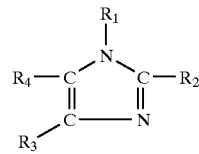

Wherein $R_1$, $R_2$, $R_3$ and $R_4$ are independently selected from the group consisting of substituted or unsubstituted alkyl groups, substituted or unsubstituted aryl groups, halogens, nitro groups and hydrogen.

2. A process according to claim 1 wherein the surface is selected from the group consisting of copper, nickel, and alloys thereof.

3. A process according to claim 1 wherein the surface is an area upon a printed circuit board.

4. A process according to claim 1 wherein the silver is plated to a thickness of 1 to 100 micro inches.

5. A process according to claim 3 wherein the surface is an area upon a printed circuit board selected from the group consisting of copper, nickel, and alloys thereof.

* * * * *